(12) United States Patent
Jin

(10) Patent No.: US 10,205,123 B2
(45) Date of Patent: Feb. 12, 2019

(54) PACKAGING METHOD FOR ORGANIC SEMICONDUCTOR DEVICE

(71) Applicant: Wuhan China Star Optoelectronics Technology Co., Ltd., Wuhan, Hubei (CN)

(72) Inventor: Jiangjiang Jin, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 109 days.

(21) Appl. No.: 15/328,387

(22) PCT Filed: Dec. 26, 2016

(86) PCT No.: PCT/CN2016/112173
§ 371 (c)(1),
(2) Date: Jan. 23, 2017

(87) PCT Pub. No.: WO2018/098875
PCT Pub. Date: Jun. 7, 2018

(65) Prior Publication Data
US 2018/0212187 A1    Jul. 26, 2018

(51) Int. Cl.
*H01L 51/40* (2006.01)
*H01L 51/52* (2006.01)
(Continued)

(52) U.S. Cl.
CPC ...... *H01L 51/5253* (2013.01); *H01L 51/0018* (2013.01); *H01L 51/5256* (2013.01);
(Continued)

(58) Field of Classification Search
CPC ....... H01L 2924/181; H01L 2924/0665; H01L 2924/12044; H01L 2227/323; H01L 51/5253; H01L 51/524
See application file for complete search history.

(56) References Cited

U.S. PATENT DOCUMENTS 5,811,177 A * 9/1998 Shi ............... H01L 51/5259
257/100
7,301,280 B2 * 11/2007 Su ............... H01L 51/5253
313/504
(Continued)

FOREIGN PATENT DOCUMENTS

CN    102867890 A    1/2013
CN    104617234 A    5/2015
(Continued)

*Primary Examiner* — Jaehwan Oh
*Assistant Examiner* — John M Parker
(74) *Attorney, Agent, or Firm* — Andrew C. Cheng

(57) ABSTRACT

A packaging method for organic semiconductor device is disclosed, and comprising steps of manufacturing an organic semiconductor device on a flexible base; forming a photoresist block having a predetermined interval with respect to the organic semiconductor device and located at two sides of the organic semiconductor device on the flexible base; depositing an inorganic layer on the photoresist block, the organic semiconductor device and the flexible base; removing the photoresist block and inorganic layer on the photoresist block; and depositing an organic layer on the inorganic layer disposed on the organic semiconductor device. The present invention can form an inorganic/organic flexible OLED packaging structure. The packaging structure cannot only omit a deposition mask used in depositing an inorganic layer in the conventional thin-film packaging art, but also effectively increase a blocking property of moisture and oxygen of OLED device in order to increase the life of the OLED device.

12 Claims, 4 Drawing Sheets

(51) Int. Cl.
*H01L 51/00* (2006.01)
*H01L 51/56* (2006.01)

(52) U.S. Cl.
CPC .......... *H01L 51/0097* (2013.01); *H01L 51/56* (2013.01); *H01L 2251/303* (2013.01); *H01L 2251/5338* (2013.01)

(56) References Cited

U.S. PATENT DOCUMENTS

| | | | | |
|---|---|---|---|---|
| 8,446,730 | B2* | 5/2013 | Chen | .............. H01L 51/0097 |
| | | | | 206/204 |
| 8,955,217 | B2* | 2/2015 | Burrows | .............. H01L 51/5256 |
| | | | | 29/841 |
| 9,681,501 | B2* | 6/2017 | Nam | .............. H01L 51/448 |
| 9,972,807 | B2* | 5/2018 | Oh | .............. H01L 51/0031 |
| 2002/0125822 | A1* | 9/2002 | Graff | .............. H01L 51/5256 |
| | | | | 313/506 |
| 2003/0170493 | A1* | 9/2003 | Chen | .............. H01L 27/3246 |
| | | | | 428/690 |
| 2004/0145311 | A1 | 7/2004 | Su | |
| 2004/0229051 | A1 | 11/2004 | Schaepkens | |
| 2007/0077849 | A1* | 4/2007 | Chen | .............. H01L 51/5253 |
| | | | | 445/25 |
| 2009/0202743 | A1 | 8/2009 | Schaepkens | |
| 2016/0126126 | A1* | 5/2016 | Chen | .............. H01L 21/6835 |
| | | | | 257/738 |
| 2017/0155081 | A1* | 6/2017 | Zeng | .............. H01L 51/5253 |

FOREIGN PATENT DOCUMENTS

| | | |
|---|---|---|
| CN | 104851849 A | 8/2015 |
| CN | 104900681 A | 9/2015 |
| CN | 105118933 A | 12/2015 |
| CN | 105914224 A | 8/2016 |
| CN | 105957976 A | 9/2016 |
| JP | 2001338754 A | 12/2001 |
| WO | WO2015043263 A1 | 4/2015 |

* cited by examiner

PACKAGING METHOD FOR ORGANIC SEMICONDUCTOR DEVICE

BACKGROUND OF THE INVENTION

1. Field of the Invention

The present invention is related to a device packaging technology field, and more particularly to a packaging method for organic semiconductor device.

2. Description of Related Art

In the recent years, Organic Light Emitting Diode (OLED) is a new flat display product at home and abroad. The OLED display device has properties of self-luminous, wide viewing angle (up to 175°), short response time (1 μs), high luminous efficiency, wide color gamut, low operation voltage (3~10V), thin panel (less than 1 mm), capable of manufacturing a large size, capable of manufacturing flexible panel and simple in process. Besides, the OLED device has a potential for low cost.

For a flexible OLED display device, one main bottleneck that limits the development of the flexible OLED display device is in the package of the flexible OLED display device. It is well known that the material for manufacturing OLED is very sensitive to moisture and oxygen. If it cannot effectively block the damage of the moisture and oxygen to the material for manufacturing OLED, a long life OLED device cannot be realized.

SUMMARY OF THE INVENTION

In order to solve the above technology problem, the purpose of the present is to provide a packaging method for organic semiconductor device which can effectively block the moisture and oxygen in the external environment.

According to one aspect of the present invention, providing a packaging method for organic semiconductor device, comprising steps of: manufacturing an organic semiconductor device on a flexible base; forming a photoresist block having a predetermined interval with respect to the organic semiconductor device and located at two sides of the organic semiconductor device on the flexible base; depositing an inorganic layer on the photoresist blocks, the organic semiconductor device and the flexible base; removing the photoresist block and the inorganic layer on the photoresist block; and depositing an organic layer on the inorganic layer disposed on the organic semiconductor device.

Wherein, further comprise steps of: alternately forming an inorganic layer and an organic layer; and depositing an inorganic layer on a last organic layer.

Wherein, the step of forming a photoresist block comprises steps of: coating a photoresist layer on the organic semiconductor device and the flexible base; using a predetermined mask plate to perform an exposure to the photoresist layer, wherein, the mask plate includes a light-shielding portion and a light-transmitting portion respectively located at two sides of the light-shielding portion, the light-shielding portion is corresponding to the organic semiconductor device, and two sides of the light-shielding portion are respectively exceeded two sides of the organic semiconductor device; and developing the photoresist layer after being exposed in order to remove the photoresist layer corresponding to the light-shielding portion so as to form a photoresist block.

Wherein, using a Plasma Enhanced Chemical Vapor Deposition (PECVD), a Pulsed Laser Deposition (PLD) or a sputter deposition method to deposit the inorganic layer.

Wherein, the inorganic layer includes at least one of $Al_2O_3$, $TiO_2$, $SiN_x$, $SiCN_x$, $SiO_x$, and $ZrO_2$.

Wherein, using an inkjet printing forming method (IJP), a Plasma Enhanced Chemical Vapor Deposition (PECVD) or a slot extrusion coating method to manufacture the organic layer.

Wherein, the organic layer includes at least one of acrylate, hexamethyldisiloxane, polyacrylate, polycarbonate and polystyrene.

Wherein, the step of removing the photoresist block and the inorganic layer on the photoresist block comprises: immersing in an organic solvent for a predetermined time such that the photoresist block is detached from the flexible base.

The beneficial effects of the present invention: the packaging method according to an embodiment of the present invention can form an inorganic/organic flexible OLED packaging structure. The packaging structure cannot only omit a deposition mask used in depositing an inorganic layer in the conventional thin-film packaging art, but also effectively increase a blocking property of moisture and oxygen of OLED device in order to increase the life of the OLED device.

BRIEF DESCRIPTION OF THE DRAWINGS

Through following to combine figures to describe in detail, the above, the other purposes, the features and benefits of the exemplary embodiment of the present disclosure will become clearer, in the figures.

DETAILED DESCRIPTION OF THE PREFERRED EMBODIMENT

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications.

In the figures, in order to illustrate the devices clearly, thickness of the layers and regions are enlarged. A same numeral in the entire specification and figures represents a same device.

FIG. 1A to FIG. 1G are flow charts of a packaging method for organic semiconductor device according to an embodiment of the present invention.

Figure 1A:
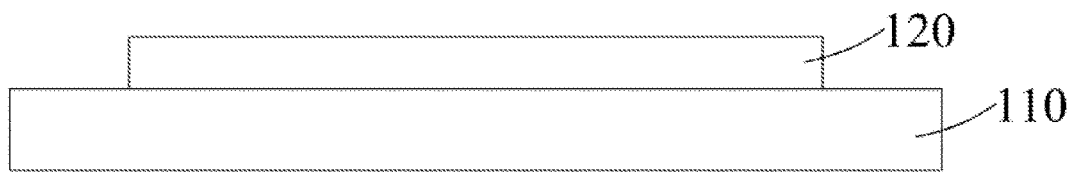
FIG. 1A to FIG. 1G is a flow chart of a packaging method for organic semiconductor device according to an embodiment of the present invention; and FIG. 2A to FIG. 2C is a flow chart of a packaging method for organic semiconductor device according to another embodiment of the present invention.

With reference to FIG. 1A, manufacturing an organic semiconductor device 120 on a flexible base 110. Here, the flexible base 110 is made of a flexible material such as polyethylene naphthalate (PEN). The organic semiconductor device 120 can be an OLED device, but the present invention is not limited.

Figure 1B:
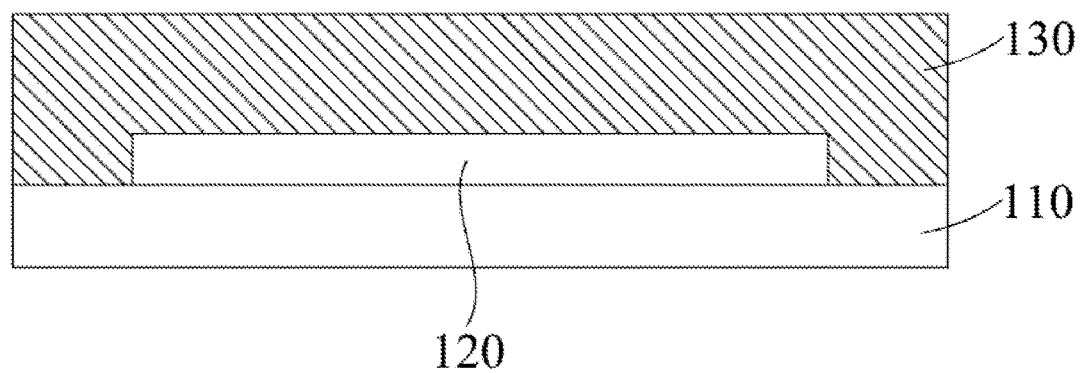

With reference to FIG. 1B, coating a photoresist layer 130 on the organic semiconductor device 120 and the flexible base 110. Specifically, using a spin-coater to coat a polymer photoresist including fluorine on the flexible base 110 and the organic semiconductor device 120. Baking for 10 min in the temperature of 80° C. in order to form the photoresist layer 130.

Figure 1C:
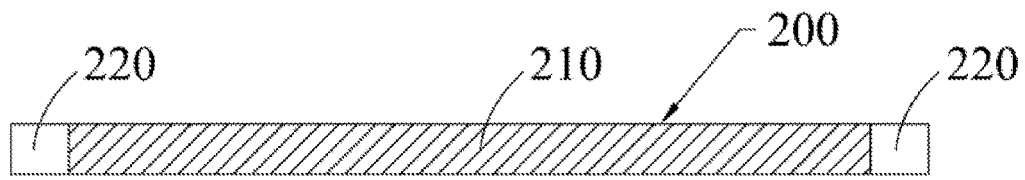
Figure 1C:
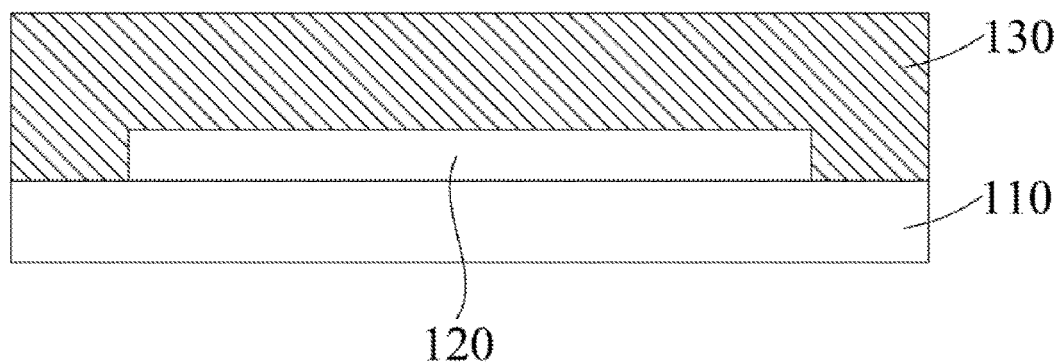

With reference to FIG. 1C, using a predetermined mask plate 200 to perform an exposure to the photoresist layer 130. Here, the mask plate 200 includes a light-shielding portion 210 and a light-transmitting portion 220 respectively located at two sides of the light-shielding portion 210. Wherein, the light-shielding portion 210 is corresponding to the organic semiconductor device 120, and two sides of the light-shielding portion 210 are respectively exceeded two sides of the organic semiconductor device 120. That is, a projection of the organic semiconductor device 120 on the light-shielding portion 210 is fully inside the light-shielding portion 210.

Figure 1D:
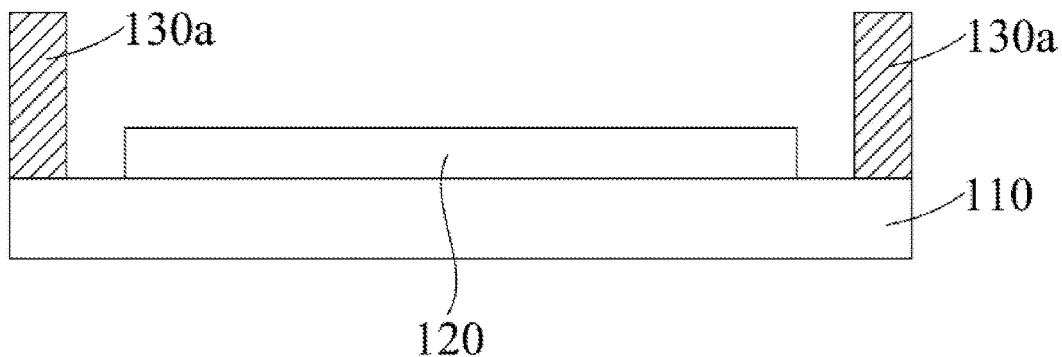

With reference to FIG. 1D, developing the photoresist layer 130 after being exposed in order to remove the photoresist layer 130 corresponding to the light-shielding portion 210 so as to form a photoresist block 130a.

Through the steps of FIG. 1B to FIG. 1D, the photoresist block 130a having a predetermined interval with respect to the organic semiconductor device 120 and located at two sides of the organic semiconductor device 120 disposed on the flexible base 110 are formed.

Figure 1E:
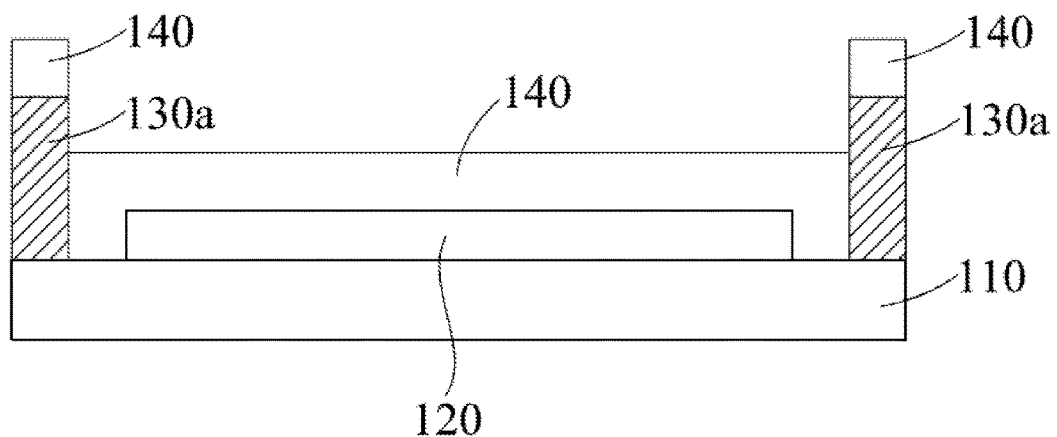

With reference to FIG. 1E, depositing an inorganic layer 140 on the photoresist block 130a, the organic semiconductor device 120 and the flexible base 110. Specifically, using a Plasma Enhanced Chemical Vapor Deposition (PECVD), a Pulsed Laser Deposition (PLD) or a sputter deposition method to deposit a layer of the inorganic layer 140 covering on the photoresist block 130a, the organic semiconductor device 120 and the flexible base 110. In the present embodiment, the inorganic layer 140 can be made by at least one of $Al_2O_3$, $TiO_2$, $SiN_x$, $SiCN_x$, $SiO_x$, and $ZrO_2$. However, the present invention is not limited. For example, the inorganic layer 140 can also be made of an inorganic material having a high water and oxygen resistance effect.

Figure 1F:
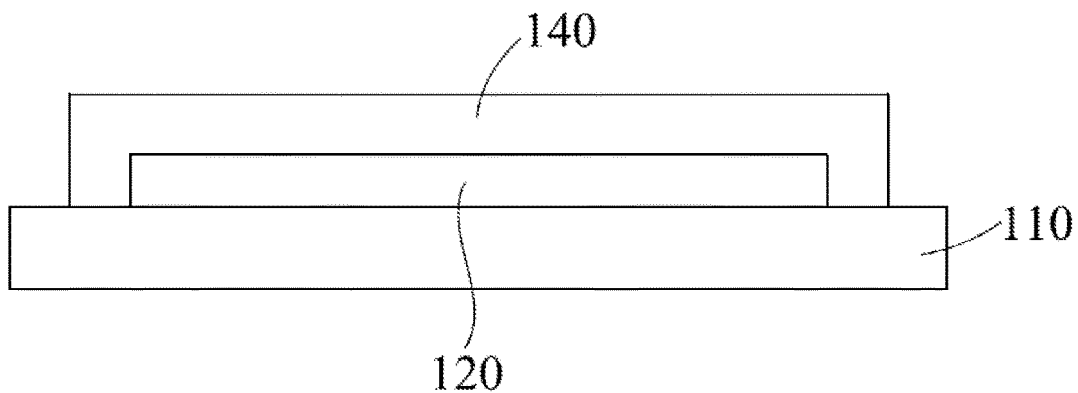

With reference to FIG. 1F, removing the photoresist block 130a and the inorganic layer 140 on the photoresist block 130a. Specifically, immersing in an organic solvent for 1~30 min. At this time, the photoresist block 130a will detach from the flexible base 110, and other parts (such as the organic semiconductor device 120, the inorganic layer 140 on the organic semiconductor device 120, the inorganic layer 140 on the flexible base 110) will be remained in order to remove the photoresist block 130a and the inorganic layer 140 on the photoresist block 130a.

Figure 1G:
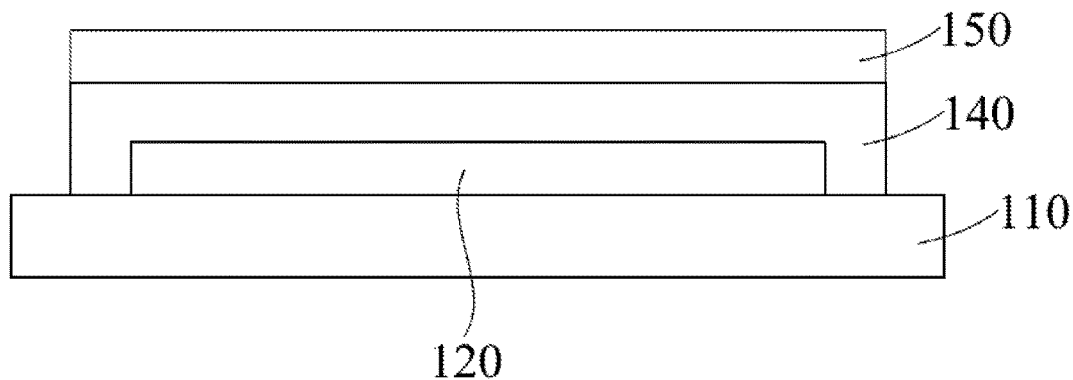

With reference to FIG. 1G, depositing an organic layer 150 on the inorganic layer 140 disposed on the organic semiconductor device 120. Specifically, using an inkjet printing forming method (IJP), a Plasma Enhanced Chemical Vapor Deposition (PECVD) or a slot extrusion coating method to manufacture the organic layer 150. In the present embodiment, the organic layer 150 can adopt at least one of acrylate, hexamethyldisiloxane, polyacrylate, polycarbonate and polystyrene, but the present invention is not limited. For example, the organic layer 150 can also adopt an organic material that can buffer a stress when the device is bent or folded in order to avoid particle contaminant from covering.

In summary, the packaging method according to an embodiment of the present invention can form an inorganic/organic flexible OLED packaging structure. The packaging structure cannot only omit a deposition mask used in depositing an inorganic layer in the conventional thin-film packaging art, but also effectively increase a blocking property of moisture and oxygen of OLED device in order to increase the life of the OLED device.

Figure 2A:
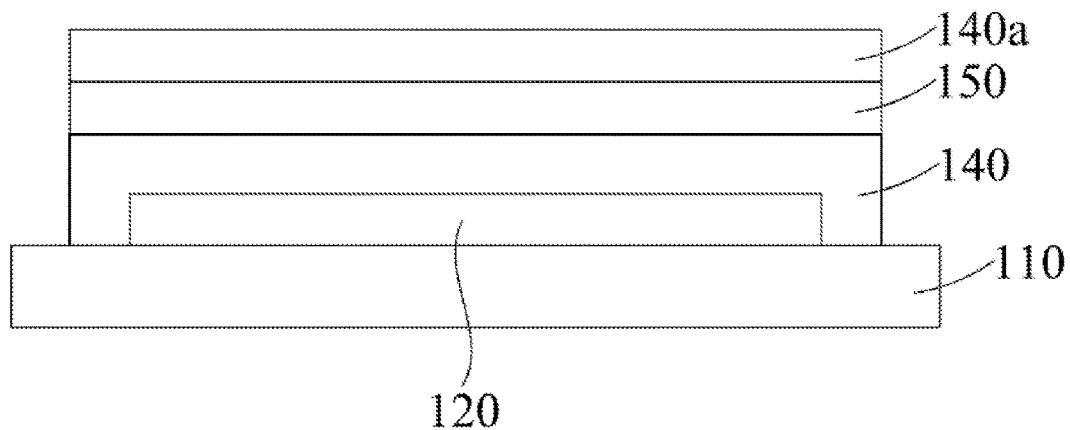
Figure 2B:
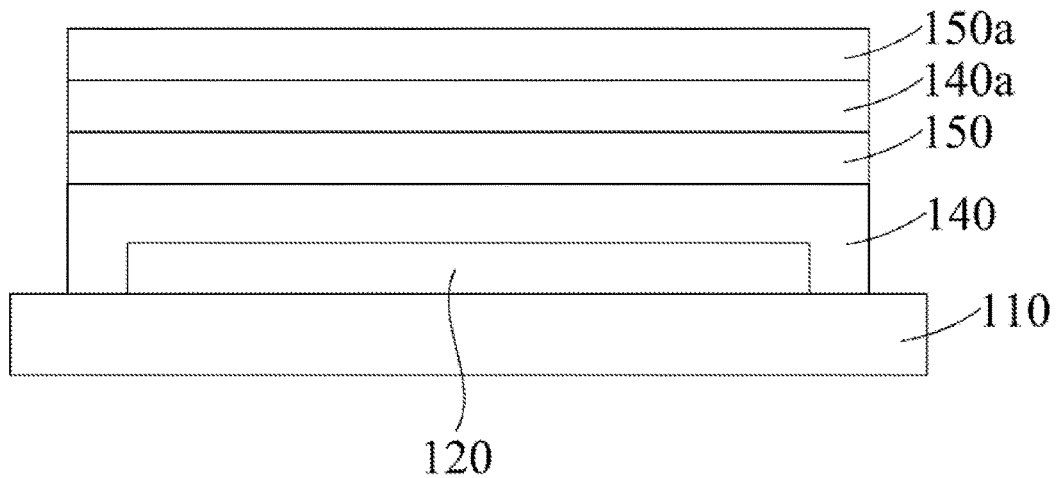
Figure 2C:
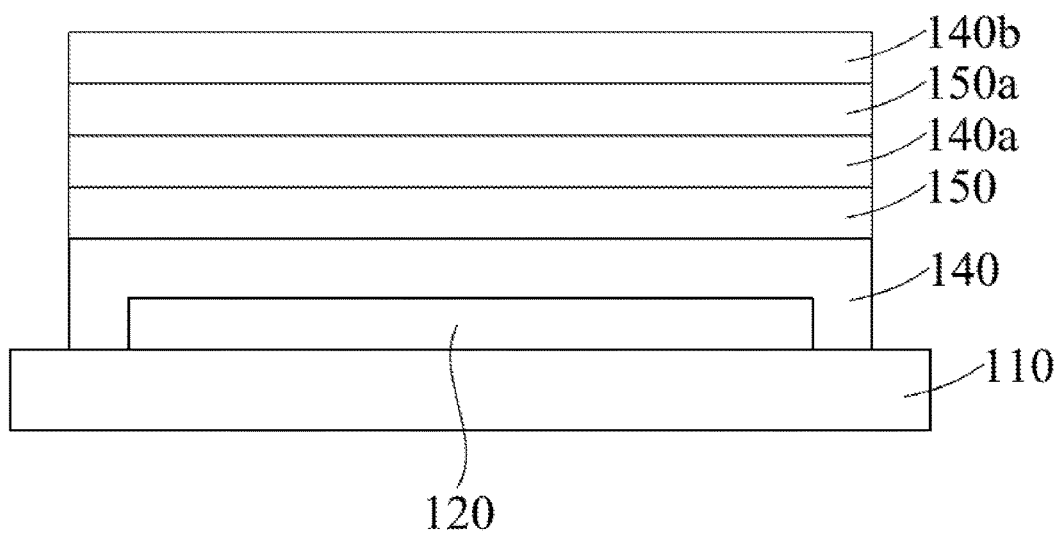

FIG. 2A to FIG. 2C are flow charts of a packaging method for organic semiconductor device according to another embodiment of the present invention.

After finishing the packaging method for an organic semiconductor device shown in FIG. 1A to FIG. 1G, the present invention further includes a packaging method shown in FIG. 2A to FIG. 2C.

With reference to FIG. 2A, depositing an inorganic layer 140a on the organic layer 150. Specifically, using a Plasma Enhanced Chemical Vapor Deposition (PECVD), a Pulsed Laser Deposition (PLD) or a sputter deposition method to deposit the inorganic layer 140a covering on the organic layer 150. In the present embodiment, the inorganic layer 140a can be made of at least one of $Al_2O_3$, $TiO_2$, $SiN_x$, $SiCN_x$, $SiO_x$, and $ZrO_2$, but the present invention is not limited. For example, the inorganic layer 140a can also be made of an inorganic material having a high water and oxygen resistance effect.

With reference to FIG. 2B, depositing an organic layer 150a on the inorganic layer 140a. Specifically, using an inkjet printing forming method (IJP), a Plasma Enhanced Chemical Vapor Deposition (PECVD) or a slot extrusion coating method to manufacture the organic layer 150a. In the present embodiment, the organic layer 150a can adopt at least one of acrylate, hexamethyldisiloxane, polyacrylate, polycarbonate and polystyrene, but the present invention is not limited. For example, the organic layer 150a can also adopt an organic material that can buffer a stress when the device is bent or folded in order to avoid particle contaminant from covering.

With reference to FIG. 2C, depositing an inorganic layer 140b on the organic layer 150a. Specifically, using a Plasma Enhanced Chemical Vapor Deposition (PECVD), a Pulsed Laser Deposition (PLD) or a sputter deposition method to deposit the inorganic layer 140b covering on the organic layer 150a. In the present embodiment, the inorganic layer 140b can be made of at least one of $Al_2O_3$, $TiO_2$, $SiN_x$, $SiCN_x$, $SiO_x$, and $ZrO_2$, but the present invention is not limited. For example, the inorganic layer 140b can also be made of an inorganic material having a high water and oxygen resistance effect.

It should be noted that before performing the step shown in FIG. 2C, repeating steps shown in FIG. 2A and FIG. 2B according to an actual requirement in order to alternately forming an inorganic layer and an organic layer.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A packaging method for organic semiconductor device, comprising steps of:
   manufacturing an organic semiconductor device on a flexible base, wherein the organic semiconductor device has a top side, a left side and a right side;
   forming a photoresist block having a predetermined interval with respect to the left side and the right side of the organic semiconductor device and located at the left side and the right side of the organic semiconductor device on the flexible base;
   depositing a first inorganic layer on the photoresist block, the organic semiconductor device and the flexible base, wherein the first inorganic layer covers on the top side, the left side and the right side of the organic semiconductor device;

removing the photoresist block and the first inorganic layer on the photoresist block; and depositing a first organic layer on the first inorganic layer disposed on the organic semiconductor device;

wherein the organic semiconductor device is an Organic Light Emitting Diode (OLED) that can emit a light; and wherein the step of forming a photoresist block comprises steps of:

coating a photoresist layer on the organic semiconductor device and the flexible base;

using a predetermined mask plate to perform an exposure to the photoresist layer, wherein, the mask plate includes a light-shielding portion and a light-transmitting portion respectively located at two sides of the light-shielding portion, the light-shielding portion is corresponding to the organic semiconductor device; and developing the photoresist layer after being exposed in order to remove the photoresist layer corresponding to the light-shielding portion so as to form a photoresist block.

2. The packaging method according to claim 1, wherein, further comprise steps of:

forming a second inorganic layer on the first organic layer; and forming a second organic layer on the second inorganic layer.

3. The packaging method according to claim 2, wherein, using a Plasma Enhanced Chemical Vapor Deposition (PECVD), a Pulsed Laser Deposition (PLD) or a sputter deposition method to deposit the first and the second inorganic layers.

4. The packaging method according to claim 2, wherein, each of the first and the second inorganic layers includes at least one of Al2O3, TiO2, SiNx, SiCNx, SiOx, and ZrO2.

5. The packaging method according to claim 2, wherein, using an inkjet printing forming method (IJP), a Plasma Enhanced Chemical Vapor Deposition (PECVD) or a slot extrusion coating method to manufacture each of the first and second organic layers.

6. The packaging method according to claim 2, wherein, each of the first and second organic layers includes at least one of acrylate, hexamethyldisiloxane, polyacrylate, polycarbonate and polystyrene.

7. The packaging method according to claim 2, wherein, the step of removing the photoresist block and the first inorganic layer on the photoresist block comprises: immersing in an organic solvent for a predetermined time such that the photoresist block is detached from the flexible base.

8. The packaging method according to claim 1, wherein, using a Plasma Enhanced Chemical Vapor Deposition (PECVD), a Pulsed Laser Deposition (PLD) or a sputter deposition method to deposit the first inorganic layer.

9. The packaging method according to claim 1, wherein, the first inorganic layer includes at least one of Al2O3, TiO2, SiNx, SiCNx, SiOx, and ZrO2.

10. The packaging method according to claim 1, wherein, using an inkjet printing forming method (IJP), a Plasma Enhanced Chemical Vapor Deposition (PECVD) or a slot extrusion coating method to manufacture the first organic layer.

11. The packaging method according to claim 1, wherein, the first organic layer includes at least one of acrylate, hexamethyldisiloxane, polyacrylate, polycarbonate and polystyrene.

12. The packaging method according to claim 1, wherein, the step of removing the photoresist block and the first inorganic layer on the photoresist block comprises: immersing in an organic solvent for a predetermined time such that the photoresist block is detached from the flexible base.

* * * * *